United States Patent
Takase et al.

(12)

(10) Patent No.: US 6,221,799 B1
(45) Date of Patent: Apr. 24, 2001

(54) DIELECTRIC CERAMIC MATERIAL

(75) Inventors: Masanori Takase; Hitoshi Yokoi; Kazushige Ohbayashi, all of Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/396,451

(22) Filed: Sep. 15, 1999

(30) Foreign Application Priority Data

Sep. 16, 1998 (JP) .................................. 10-261656

(51) Int. Cl.$^7$ .................................. C04B 35/465
(52) U.S. Cl. .................................. 501/136
(58) Field of Search .................................. 501/136

(56) References Cited

U.S. PATENT DOCUMENTS

| 5,188,993 | 2/1993 | Takahashi et al. | 501/136 |
|---|---|---|---|
| 5,320,991 | * 6/1994 | Takahashi et al. | 501/136 |
| 5,444,028 | * 8/1995 | Takahashi et al. | 501/136 |
| 5,854,160 | * 12/1998 | Yoon et al. | 501/136 |

FOREIGN PATENT DOCUMENTS

| 5-211007 | 8/1993 | (JP) . |
|---|---|---|
| 5-211009 | 8/1993 | (JP) . |

* cited by examiner

*Primary Examiner*—Karl Group
(74) *Attorney, Agent, or Firm*—Sughrue, Mion, Zinn Macpeak & Seas, PLLC

(57) ABSTRACT

Disclosed is a dielectric ceramic material represented by composition formula: $(uLi_2O—vNa_2O)—wSm_2O_3—xCaO—yTiO_2$, having a solid solution structure made up of perovskite crystals represented by $Ca_{1-x}Sm_{2x/3}TiO_3$, perovskite crystals represented by $Li_{1/2}Sm_{1/2}TiO_3$, and perovskite crystals represented by $Na_{1/2}Sm_{1/2}TiO_3$. Substitution of part of Ti in the composition with at least one of Ga and Al provides a dielectric ceramic material with a particularly increased value of unloaded quality coefficient. The absolute value of the temperature coefficient of resonance frequency is controlled to a small value by adjusting the proportions of Li and Na.

22 Claims, 1 Drawing Sheet

DIELECTRIC CERAMIC MATERIAL

BACKGROUND OF THE INVENTION

1. Field of the invention

This invention relates to a dielectric ceramic material. More particularly, it relates to a dielectric ceramic material which exhibits excellent dielectric characteristics, i.e., a high relative dielectric constant (hereinafter represented by $\in_r$) in a high frequency region, a high unloaded quality coefficient (hereinafter represented by $Q_u$), and a small absolute value of the temperature coefficient of resonance frequency (hereinafter resonance frequency is represented by $f_0$, and the temperature coefficient thereof is represented by $\tau_f$). The dielectric ceramic material of the present invention is suited for use in multilayer circuit boards, resonators and filters particularly for use in a high frequency region, an impedance matching element for various microwave circuits, and the like.

2. Description of the Related Art

With the recent increase of communication information, rapid progress is being made in various communication systems utilizing the microwave region, such as mobile telecommunication systems, satellite communication systems, positioning systems using communication data, and satellite broadcasting. Use of the communication systems in a submillimeter wave region has been demanded. Many dielectric materials have been developed with the rapid progress. These dielectric materials are required to have (1) a high relative dielectric constant $\in_r$, (2) a high unloaded quality coefficient $Q_u$ (i.e., a small dielectric loss $1/Q_u$), and (3) a small absolute value of $\tau_f$ (i.e., small temperature dependence of $f_0$).

In particular, a dielectric material used in a submillimeter wave region is required to have an especially high $Q_u$, and it is desirable that $\tau_f$ be controllable freely around 0 ppm/° C.

Microwave dielectric porcelain compositions based on $Li_2O$—$CaO$—$Sm_2O_3$—$TiO_2$ are disclosed in JP-A-5-211007 and JP-A-5-211009. These materials have a particularly excellent $\in_r$ value but a relatively small $Q_u$. While the $\tau_f$ is relatively controlled by the composition, the precise control has been difficult, and control to nearly 0 ppm/° C. has not been realized as yet.

SUMMARY OF THE INVENTION

An object of the present invention is to provide a dielectric ceramic material which has a high $Q_u$ value even in a submillimeter wave region, can have its $\tau_f$ controlled around 0 ppm/° C., and exhibits a high $\in_r$ value.

The entire disclosure of each and every foreign patent application from which the benefit of foreign priority has been claimed in the present application is incorporated herein by reference, as if fully set forth.

DETAILED DESCRIPTION OF THE INVENTION

Figure 1A:
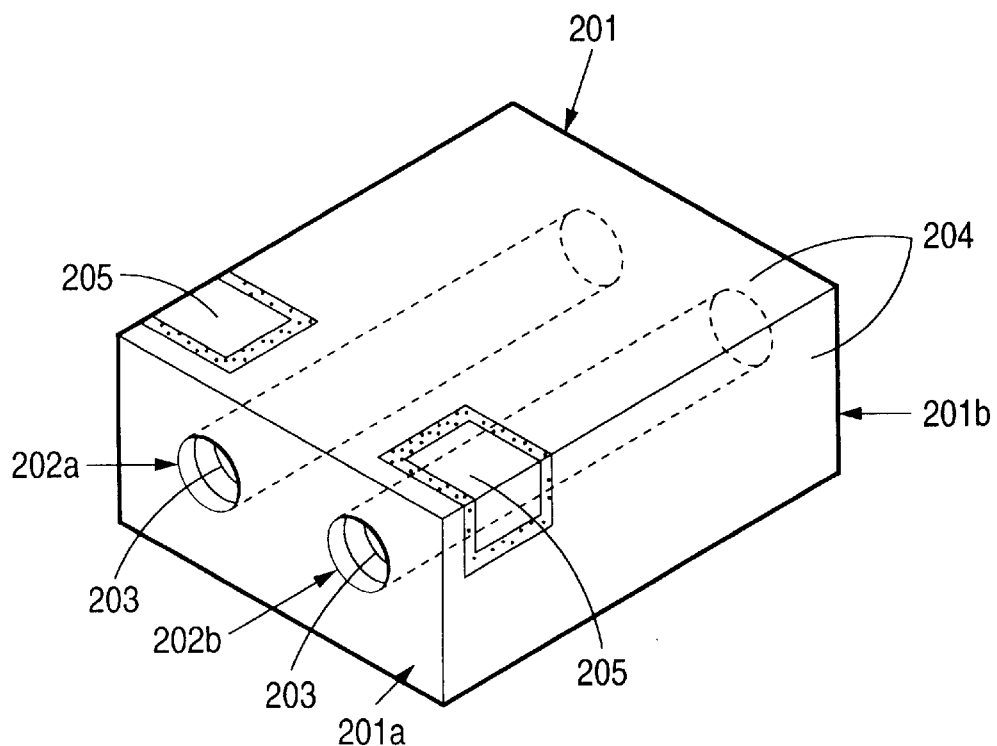
FIG. 1A is a perspective view of a dielectric filter utilizing the dielectric material of the present invention.

The present invention provides a dielectric ceramic material represented by composition formula: ($uLi_2O$—$vNa_2O$)—$wSm_2O_3$—$xCaO$—$yTiO_2$, wherein $u+v+w+x+y=100$ mol %, $0<u<40$, $0<v<40$, $0<u+v\leq40$, $0<w\leq30$, $0<x\leq40$, and $0<y\leq80$ (hereinafter referred to as dielectric ceramic material A).

The present invention also provides a dielectric ceramic material represented by composition formula: ($uLi_2O$—$vNa_2O$)—$wSm_2O_3$—$xCaO$—($yTiO_2$—$zM_2O_3$), wherein M represents Ga or Al; $u+v+w+x+y+z=100$ mol %, $0\leq u\leq40$, $0\leq v\leq40$, $0<u+v\leq40$, $0<w\leq30$, and $0<x\leq40$, $0<y<80$, $0<z<80$, and $0<y+z\leq80$ (hereinafter referred to as dielectric ceramic material B).

In dielectric ceramic material A, the molar ratio of the Li oxide (u) and that of the Na oxide (v) satisfy $0<u<40$ and $0<v<40$, respectively. That is, dielectric ceramic material A contains both Li oxide and Na oxide. The total molar ratio of the Na oxide and the Li oxide (i.e., u+v) satisfies $0<u+v\leq40$, preferably $3\leq u+v\leq15$, still preferably $5\leq u+v\leq8$.

It is preferred that u and v satisfy $3\leq u<40$ and $0<v\leq30$. When u and v satisfy this ranges, it is preferred in the point that $\tau_f$ is not greatly shifted to the plus side.

In dielectric ceramic material B, the molar ratio of Li oxide (u) and that of Na oxide (v) satisfy $0\leq u\leq40$ and $0\leq v\leq40$, respectively, and the total molar ratio of the Li oxide and the Na oxide (u+v) satisfies $0<u+v\leq40$. That is, dielectric ceramic material B contains at least one of Li oxide and Na oxide. The total molar ratio u+v is preferably equal to or greater than 3 and equal to or smaller than 15, still preferably equal to or greater than 5 and equal to or smaller than 8.

It is preferred that u and v satisfy $3\leq u\leq40$ and $0\leq v\leq30$. When u and v satisfy this ranges, it is preferred in the point that $\tau_f$ is not greatly shifted to the plus side.

According to the desired dielectric characteristics, Li oxide may be excluded from the composition in dielectric ceramic material B.

If dielectric ceramic materials A and B contain excessive Li oxide and Na oxide, $Q_u xf_0$ tends to be small.

The molar ratio of Sm oxide (w) in dielectric ceramic materials A and B satisfies $0<w\leq30$, preferably $8\leq w\leq20$, still preferably $10<w\leq16$. Where Sm oxide is present in excess, $\in_r$ tends to be reduced.

The molar ratio of Ca oxide (x) in dielectric ceramic materials A and B satisfies $0<x\leq40$, preferably $5<x\leq30$, still preferably $9<x\leq18$. Where Ca oxide is present in excess, $\tau_f$ tends to be greatly shifted to the plus side.

The molar ratio of Ti oxide (y) in dielectric ceramic material A satisfies $0<y\leq80$, preferably $30\leq y\leq77$, still preferably $50\leq y\leq75$.

The molar ratio of Ti oxide (y) and that of at least one of Ga and Al oxides (z) in dielectric ceramic material B satisfy $0<y<80$ and $0<z<80$. That is, dielectric ceramic material B has part of Ti displaced with at least one of Ga and Al to contain at least one of Ga oxide and Al oxide. The total molar ratio of Ti oxide and at least one of Ga and Al oxides (i.e., y+z) satisfies $0<y+z\leq80$, preferably $30\leq y+z\leq75$, still preferably $60\leq y+z\leq70$.

If the dielectric ceramic material B contains Ti oxide and Ga or Al oxide in excessive amounts, $\in_r$ tend to be low.

$Q_u xf_0$ increases with the ratio of z to y in ($yTiO_2$—$zM_2O_3$), i.e., the degree of substitution of Ti with at least one of Ga and Al. However, if the degree of substitution exceeds 50 mol % based on the Ti oxide, $\in_r$ tends to decrease due to phase separation or change of the crystal structure. Accordingly, it is preferred that $40\leq y<80$ and $0\leq z<40$, particularly $30\leq y\leq60$ and $3\leq z\leq35$.

In the present invention, where $5 \leq u+v \leq 20$, a $\in_r$ value of 75 or greater and $Q_u x f_0$ of 6000 GHz or greater can be secured. In particular where u, v, w, x, and y satisfy $5 \leq u \leq 7$, $1 \leq v \leq 3$, $12 \leq w \leq 14$, $12 \leq x \leq 18$, and $60 \leq y \leq 65$, $\in_r$ of 99 or greater, $Q_u x f_0$ of 6100 GHz or greater, and $\tau_f$ of −9 to 12 ppm/° C. can be secured.

Further, where $4 \leq u \leq 8$, $0 \leq v \leq 3$, $12 \leq w \leq 15$, $16 \leq x \leq 19$, $32 \leq y \leq 35$, and $28 \leq z \leq 32$, it is possible to obtain $\in_r$ of 58 or greater and $Q_u x f_0$ of 10080 GHz or greater.

It has been known that many dielectric materials having a perovskite structure exhibit excellent dielectric characteristics. The dielectric ceramic material according to the present invention is considered to be a solid solution structure made up of $Ca_{1-x}Sm_{2x/3}TiO_3$ that has a perovskite structure and exhibits a very high $\in_r$ value, a large $Q_u x f_0$ value, and a positive $\tau_f$ value; $Li_{1/2}Sm_{1/2}TiO_3$ that has a perovskite structure and exhibits a high $\in_r$ value and a large $\tau_f$ value in the minus side; and $Na_{1/2}Sm_{1/2}TiO_3$ that has a perovskite structure and exhibits a large $Q_u x f_0$ value and a large $\tau_f$ value in the plus side. The excellent dielectric characteristics of the ceramic material of the invention seems attributed to this structure. Where the dielectric ceramic material of the invention has such a solid solution composition or a nearly solid solution composition, it is possible to obtain $\in_r$ of nearly 100, $Q_u x f_0$ of about 6000 GHz, and $\tau_f$ of around 0 ppm/° C. Where part of $Ti^{4+}$ contained in the structure is replaced with at least one of $Ga^{3+}$ and $Al^{3+}$, whose ionic radius is relatively close to that of $Ti^{4+}$ and whose valence is different from that of Ti by +1, $Q_u x f_0$ is improved. Further, the value of $\tau_f$ can be controlled by varying the proportions of Li oxide and Na oxide, which exhibit $\tau_f$ values of opposite signs.

EXAMPLES

The present invention will now be illustrated in greater detail by way of Examples.

Predetermined amounts of commercially available powders of $Li_2CO_3$ (purity: 99%), $Na_2CO_3$ (purity: 99%), $Sm_2O_3$ (purity: 99.9%, D50: 1.9 μm), $CaCO_3$ (purity: 99.9%, D50: 2.6 μm), $TiO_2$ (purity: 99%, Average particle size: 0.25 μm), $Al_2O_3$ (purity: 99.9%, Particle size: 2 to 3 μm) and $Ga_2O_3$ (purity: 99.9%) were weighed out (100 g in total) to give the final composition shown in Tables 1 and 2 below in terms of the respective oxides.

The powders were wet mixed in a ball mill for 15 hours using ethanol as a medium, and the resulting slurry was dried on a hot water bath and calcined in the air atmosphere at 1000° C. for 2 hours. The calcined product was wet ground for 15 hours in a ball mill together with a wax binder, a dispersant, and ethanol. The resulting slurry was dried on a hot water bath, granulated and compacted under a pressure of 10 MPa into a rod form of 20 mm in diameter and 12 mm in thickness. The rod compact was subjected to cold isostatic pressing (CIP) under a pressure of 150 MPa, and then sintered by firing at 1300° C. for 5 hours in the air atmosphere to obtain a sintered body.

After surface of the resulting sintered body, i.e., a dielectric material, was ground with a #200 diamond, $\in_r$, $Q_u$, and $\tau_f$ were measured by the Hakki and Coleman's method in a measuring frequency range of from 1 to 3 GHz at a measuring temperature of from 25 to 80° C. The $\tau_f$ value was calculated according to equation: $\tau_f = (f_{80} - f_{25})/\{(f_{25} \times (80-25)\} \times 10^6$, wherein $f_{25}$ is a resonance frequency at 25° C., and $f_{80}$ is a resonance frequency at 80° C.

The results obtained are shown in Tables 1 and 2.

TABLE 1

| Run | Composition | | | | | Dielectric Characteristics | | |
|---|---|---|---|---|---|---|---|---|
| No. | u | v | w | x | y | $\in_r$ | $Q_u x f_0$ (GHZ) | $\tau_f$ (ppm/° C.) | Remark |
| 1 | 3 | 3 | 33 | 6 | 56 | 31 | 4890 | 91 | comparison |
| 2 | 3 | 3 | 15 | 10 | 69 | 79 | 6200 | 1 | invention |
| 3 | 4 | 2 | 15 | 10 | 69 | 78 | 6180 | −10 | " |
| 4 | 3 | 4 | 15 | 10 | 69 | 79 | 6270 | 8 | " |
| 5 | 7 | 1 | 13 | 16 | 63 | 99 | 6110 | −9 | " |
| 6 | 6 | 2 | 13 | 16 | 63 | 99 | 6140 | 2 | " |
| 7 | 5 | 3 | 13 | 16 | 63 | 99 | 6180 | 12 | " |
| 8 | 3 | 12 | 11 | 16 | 59 | 88 | 6050 | 112 | " |
| 9 | 25 | 20 | 15 | 15 | 20 | 85 | 3070 | 66 | comparison |

TABLE 2

| Run | Composition | | | | | | | Dielectric Characteristics | | | |
|---|---|---|---|---|---|---|---|---|---|---|---|
| | | | | | | z | | | | | |
| No. | u | v | w | x | y | $Ga_2O_3$ | $Al_2O_3$ | $\in_r$ | $Q_u x f_0$ (GHZ) | $\tau_f$ (ppm/° C.) | Remark |
| 10 | 7 | — | 13 | 17 | 58 | 5 | — | 89 | 7200 | −11 | invention |
| 11 | 6 | 1 | 13 | 17 | 53 | 10 | — | 80 | 7940 | 0 | " |
| 12 | 7 | — | 13 | 17 | 53 | 10 | — | 80 | 7810 | −16 | " |
| 13 | 7 | — | 13 | 17 | 43 | 20 | — | 71 | 9340 | −12 | " |
| 14 | 6 | — | 14 | 16 | 44 | 20 | — | 70 | 9760 | −22 | " |
| 15 | 6 | 1 | 13 | 17 | 33 | 30 | — | 59 | 12030 | 1 | " |
| 16 | 7 | — | 13 | 17 | 33 | 30 | — | 58 | 11700 | −10 | " |
| 17 | 6 | 2 | 13 | 16 | 3 | 60 | — | 37 | 8750 | 65 | " |
| 18 | 3 | 2 | 2 | 3 | 5 | 85 | — | 22 | 3420 | 72 | comparison |
| 19 | 6 | 1 | 15 | 15 | 58 | — | 5 | 78 | 6900 | 2 | invention |
| 20 | 6 | 1 | 15 | 15 | 53 | — | 10 | 75 | 7350 | 1 | " |
| 21 | 7 | — | 13 | 17 | 43 | — | 20 | 69 | 8060 | 20 | " |
| 22 | 5 | — | 14 | 18 | 34 | — | 30 | 59 | 10080 | 30 | " |
| 23 | 6 | 1 | 10 | 10 | 13 | — | 60 | 35 | 8340 | 61 | " |
| 24 | 3 | 2 | 2 | 3 | 5 | — | 85 | 21 | 3190 | 69 | comparison |

The results in Table 1 prove that $\tau_f$ is controllable by adjusting the proportions of the alkali metal oxides, i.e., $Li_2O$ and $Na_2O$ in dielectric ceramic material A (Run Nos. 2 to 8).

The results in Table 2 prove that the $Q_u xf_0$ value increases to 7200 to 12030 GHz with an increase in degree of substitution of Ti with Ga (Run Nos. 10 to 17) and increases to 6900 to 10800 GHz with an increase in degree of substitution of Ti with Al (Run Nos. 19 to 23). It can be seen accordingly that the $Q_u xf_0$ value can be controlled by substituting Ti with at least one of Ga and Al.

(1) A First Example of Dielectric Filter Prepared by Using Dielectric Material of the Invention The dielectric material of the present invention may be used in a dielectric filter described in U.S. Pat. No. 5,612,654, hereby incorporated by reference.

Figure 1B:
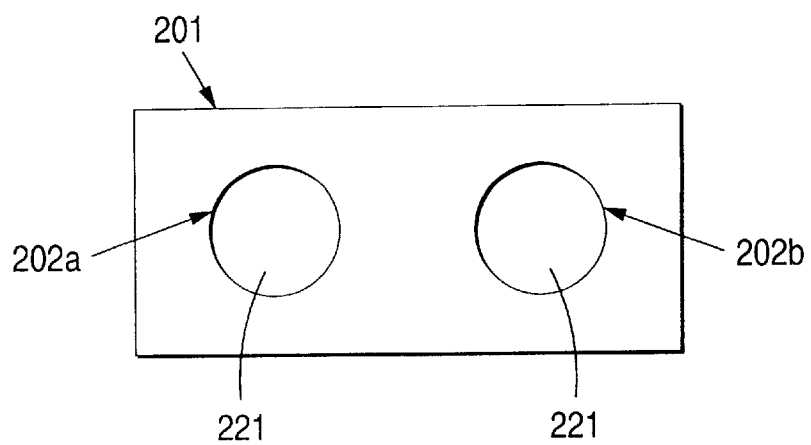
FIG. 1B is a front view taken from the open end surface of FIG. 1A.

For example, the dielectric filter shown in FIGS. 1A and 1B includes resonator holes 202a and 202b.

In the structure shown in FIGS. 1A and 1B, the coupling between the two resonators formed at resonator holes 202a and 202b is inductive coupling, and one attenuation pole is formed in the high frequency range of the pass band. A pair of input/output electrodes 205 are formed at prescribed portions on the outer surface of dielectric block 201. Inner conductors 203 are formed on the inner surfaces of resonator holes 202a and 202b.

While the invention has been described in detail and with reference to specific examples thereof, various changes and modifications can be made within the scope thereof according to the final use. That is, the dielectric ceramic materials may contain other components or unavoidable impurities as long as the dielectric characteristics are not substantially affected thereby.

The dielectric ceramic material having composition formula: $(uLi_2O\text{—}vNa_2O)\text{—}wSm_2O_3\text{—}xCaO\text{—}yTiO_2$ exhibits excellent dielectric characteristics. $Q_u xf_0$ can be controlled in a range of large values by substituting Ti in the composition formula with Ga or Al. Further, the value $\tau_f$ is controllable by adjusting the proportions of Li and Na.

What is claimed is:

1. A dielectric ceramic material represented by the composition formula: $(uLi_2O\text{—}vNa_2O)\text{—}wSm_2O_3\text{—}xCaO\text{—}(yTiO_2\text{—}zM_2O_3)$, wherein M represents at least one of Ga and Al; $u+v+w+x+y+z=100$ mol %, $0 \leq u \leq 40$, $0 \leq v \leq 40$, $0 < u+v \leq 40$, $0 < w \leq 30$, $0 < x \leq 40$, $0 < y < 80$, $0 < z < 80$, and $0 < y+z \leq 80$.

2. A dielectric ceramic material according to claim 1, wherein $3 \leq u \leq 40$, and $0 \leq v \leq 30$.

3. A dielectric ceramic material according to claim 1, wherein $40 \leq y < 80$, and $0 \leq z < 40$.

4. A dielectric ceramic material according to claim 2, wherein $40 \leq y < 80$, and $0 \leq z < 40$.

5. A dielectric ceramic material according to claim 1, wherein M represents Ga.

6. A dielectric ceramic material according to claim 1, wherein M represents Al.

7. A dielectric ceramic material according to claim 1, wherein $3 \leq u+v \leq 15$.

8. A dielectric ceramic material according to claim 1, wherein $5 \leq u+v \leq 8$.

9. A dielectric ceramic material according to claim 1, wherein $8 \leq w \leq 20$.

10. A dielectric ceramic material according to claim 1, wherein $10 < w \leq 16$.

11. A dielectric ceramic material according to claim 1, wherein $5 < x \leq 30$.

12. A dielectric ceramic material according to claim 1, wherein $9 < x \leq 18$.

13. A dielectric ceramic material according to claim 1, wherein $30 \leq y+z \leq 75$.

14. A dielectric ceramic material according to claim 1, wherein $60 \leq y+z \leq 70$.

15. A dielectric ceramic material according to claim 1, wherein $30 \leq y \leq 60$ and $3 \leq z \leq 35$.

16. A dielectric filter comprising a dielectric ceramic material according to claim 1.

17. A dielectric ceramic material according to claim 1, wherein $4 \leq u \leq 8$, $0 \leq v \leq 3$, $12 \leq w \leq 15$, $16 \leq x \leq 19$, $32 \leq y \leq 35$ and $28 \leq z \leq 32$.

18. A dielectric ceramic material according to claim 1, wherein $5 \leq z \leq 80$.

19. A dielectric ceramic material according to claim 1, wherein $10 \leq z \leq 80$.

20. A dielectric ceramic material according to claim 1, wherein $20 \leq z \leq 80$.

21. A dielectric ceramic material according to claim 1, wherein $30 \leq z \leq 80$.

22. A dielectric ceramic material according to claim 1, wherein $60 \leq z \leq 80$.

* * * * *